(12) United States Patent
Duignan et al.

(10) Patent No.: US 6,835,426 B2
(45) Date of Patent: Dec. 28, 2004

(54) METHOD AND APPARATUS FOR PULSE-POSITION SYNCHRONIZATION IN MINIATURE STRUCTURES MANUFACTURING PROCESSES

(75) Inventors: Michael T. Duignan, deceased, late of Washington, DC (US); by Susan Gordon, legal representative, Washington, DC (US); C. Paul Christensen, Fairhaven, MD (US)

(73) Assignee: Potomac Photonics, Inc., Lanham, MD (US)

( * ) Notice: Subject to any disclaimer, the term of this patent is extended or adjusted under 35 U.S.C. 154(b) by 0 days.

(21) Appl. No.: 10/391,785

(22) Filed: Mar. 20, 2003

(65) Prior Publication Data
US 2003/0157271 A1 Aug. 21, 2003

Related U.S. Application Data

(63) Continuation-in-part of application No. 09/744,017, filed as application No. PCT/US00/052400 on May 24, 2000, now abandoned.

(51) Int. Cl.$^7$ .................. C23C 14/32; C23C 14/28; B23K 26/08
(52) U.S. Cl. .................. 427/596; 427/561; 219/121.62; 219/121.81; 219/121.82; 219/121.85
(58) Field of Search .................. 427/596, 597, 427/561, 586; 219/121.61, 121.62, 121.73, 121.78–121.82, 121.85

(56) References Cited

U.S. PATENT DOCUMENTS

| | | | | |
|---|---|---|---|---|
| 4,190,759 A | * | 2/1980 | Hongo et al. | 219/121 LM |
| 4,752,455 A | * | 6/1988 | Mayer | |
| 4,895,735 A | * | 1/1990 | Cook | |
| 5,292,559 A | * | 3/1994 | Joyce, Jr. et al. | 427/597 |
| 5,389,196 A | * | 2/1995 | Bloomstein et al. | 156/643 |
| 5,736,464 A | * | 4/1998 | Opower | 427/597 |
| 5,935,462 A | * | 8/1999 | Tatah | 427/556 |
| 6,025,110 A | * | 2/2000 | Nowak | 427/596 |
| 6,583,381 B1 | * | 6/2003 | Duignan | 219/121.69 |
| 6,649,861 B2 | * | 11/2003 | Duignan | 219/121.6 |
| 6,709,720 B2 | * | 3/2004 | Hayakawa et al. | 427/555 |
| 6,760,973 B1 | * | 7/2004 | Koide | 29/890.1 |

\* cited by examiner

Primary Examiner—Marianne Padgett
(74) Attorney, Agent, or Firm—Rosenberg, Klein & Lee

(57) ABSTRACT

Pulse-position synchronized deposition of a material in miniature structure manufacturing processes is carried out in a fabrication tool including a material carrier element, a source of energy generating pulses of energy, a substrate, and a control unit operatively coupled to the source of energy, substrate, and the material carrier element. The control unit exposes a first area of the material carrier element to a first pulse of energy, pauses the exposure while initiating relative motion between the source of energy and the substrate at a predetermined first speed and relative motion between the material carrier element and the energy source at a predetermined second speed which is a function of the first speed, and slowing (or stopping) relative motion between the energy source, material carrier element, and the substrate, while exposing the unablated area of the material carrier element adjacent to previously ablated area to a second pulse of energy.

17 Claims, 8 Drawing Sheets

$V_{carrier} = f(V_{substrate})$

METHOD AND APPARATUS FOR PULSE-POSITION SYNCHRONIZATION IN MINIATURE STRUCTURES MANUFACTURING PROCESSES

REFERENCE TO RELATED APPLICATIONS

This Continuation-in-Part Patent Application is based on patent application Ser. No. 09/744,017, filed on Jan. 19, 2001, now abandon, which is the national stage of PCT/US00/09818 filed May 24, 2000.

FIELD OF THE INVENTION

The present invention relates to a method and apparatus for the manufacture of miniature structures. In particular, this invention directs itself to pulse-position synchronization for use in Direct Write processes.

Still further, the present invention relates to a method for pulse-position synchronization in which a target is initially exposed to a first pulse of energy. Subsequently a pause in the target exposure exists during which time the relative position between the target and the energy source is adjusted which permits a pause time for positioning the next area of the target which is to be exposed. Once positioning of the target has been achieved, the target is exposed to a second pulse of energy.

Additionally, the present invention relates to a technique for pulse-position synchronization in a fabrication tool which includes a target, a source of energy, a substrate, and control unit operatively coupled to the source of energy as well as the target and the substrate. The fabrication tool is operated in patterned "additive" and patterned "subtractive" modes of operation. In the "additive" mode of operation, the target is a material carrier element which has a deposition layer where predetermined areas are ablated in a patterned manner by pulses of energy generated by the source of energy (laser) under the control of a control unit. The depositable material from the deposition layer of the material carrier element is then deposited on a substrate within predetermined deposition regions corresponding to the ablated areas of the deposition layer. The control unit synchronizes the relative motion of the target, substrate and the source of energy in order to (1) expose fresh areas of the target to the laser pulse, (2) provide uniformity of the material deposition on the substrate, and (3) optimize the motion patterns. Thus, miniature structures in the nature of semiconductor chips, electrical and mechanical-electrical elements may be manufactured.

With respect to the "subtractive" mode of operation, the material carrier element is removed from the laser path, whereby the substrate is exposed to pulses of energy ablating the surface of the substrate in patterned manner for cleaning or trimming the substrate as well as for creating vias, channels, guides, through holes, etc.

BACKGROUND OF THE INVENTION

Miniature structures are becoming more widely used as technology advances and a plethora of electrical systems are used in miniaturization of common industrial and domestic appliances. Such structures may be found in TV sets, radios, vehicles, kitchen appliances, computers, etc. Due to the advantage of the use of miniature structures in such electrical systems, a large emphasis has been placed on the development of a wide variety of different manufacturing technologies for fabrication of miniaturized components.

Among others, a Direct Write technology has been developed and successfully applied which uses a laser beam for ablating a source of depositable material. The ablated depositable material from the source is then transferred and deposited at predetermined areas of a workpiece to create miniature structures thereon.

Additionally, a laser micromachining process has been developed which uses a laser beam to ablate predetermined areas of a workpiece to a predetermined depth in order to form vias, through holes, or miniature recesses. This type of process is also applicable to etching, trimming, or cleaning of the workpiece.

In both the Direct Write processes and the laser micromachining processes, coordination of motion between all elements of the system is important. Thus, coordination and control of substrate motion, laser beam scanning, or combinatorial relative motion thereof is of vital importance in the manufacturing process. Specifically, if laser power is maintained in a constant "on" mode during acceleration or deceleration of the relative motion of the substrate and the laser beam, a non-constant dose of a depositable material is delivered to the substrate. This interferes with deposition processes, resulting in locally varying thickness of the fabricated miniature structures.

Still further, the relative motion between the laser and the substrate must be conducted at a speed of relative motion, since excessive laser dwell may overheat and damage sensitive components already existing on the substrate. In the case of laser micromachining processes, variation of the depth of ablation may result which is unsatisfactory for applications where smooth structures with constant thickness or depth are required for optimum performance.

Commercial systems exist which address the problem of variations in laser exposure due to acceleration or deceleration of relative motion between the substrate and the laser beam. For example, the control unit (Aerotech PC-PSO Personal Computer Add-On board) monitors multi-axis motion and produces position synchronized electrical pulses capable of firing a laser at precise increments of travel. The interval can be software selectable for dynamic control of the deposition process or micromachining process. This control unit typically produces one pulse every time the relative position of the substrate changes by m microns, where m is a number that can be set in the software program that is used in conjunction with the control unit to control the substrate motion. When motion occurs in 2 or 3 dimensions, the control unit is normally capable of carrying out the necessary vector algebra to compute the linear change in position.

If the pulse produced by the control unit every n microns is used to trigger the pulsed laser, the separation between successive laser pulses on the substrate will be constant and variations in exposure of illuminated areas will be eliminated. This approach to control the laser firing is normally called pulse-position synchronization. Since all of the processes in the controller and laser needed to fire the laser pulse occur in microseconds, there is no need to slow or stop the relative motion to achieve position-synchronized pulsing of the laser.

As an example, the system may provide generation of laser pulses each 0.25 micrometer of travel in any direction. Such commercially available systems permit bit mapping laser pulses by clocking-out trigger pulses in accordance with a predetermined pattern while scanning the laser or changing a substrate position where an analogous technique is used in laser printer technology.

Although pulse-position synchronization is routinely used in laser micromachining to remove material, it has not previously been applied to the forward transfer technique for material deposition. Without pulse-position synchronization the number of forward transfer events per unit of displacement varies as the substrate accelerates and decelerates, resulting in thickness variations of the deposited material.

Further, failure to provide precise coordination of the relative motion of the target and the laser beam with activation-deactivation of the laser radiation in conventional systems may cause the ablation of unintended areas of a target, or alternatively deposition of a depositable material on unaimed or unwanted regions. In these cases, the laser pulse may impinge not only onto an area of interest but also onto neighboring regions, thus deteriorating the quality and performance of manufactured miniature structures.

Still further in such conventional systems during the Direct Write processes, successive laser pulses impinge at the source of the depositable material (target ribbon) at areas which may be not close enough to each other which results in inefficient use of the depositable material. If the laser pulses impinge onto already ablated area of the source of the depositable material, the depositable material is not delivered to a required area on the substrate which reduces the yield of high quality miniature structures.

Another disadvantage results from impingement of the laser beam on previously ablated areas of the source of a depositable material which causes unwanted direct access of the laser beam to the surface of the substrate. This may have the effect of destroying structures located on the surfaces of the substrate.

Due to the aforementioned reasons, it is clear that the target ribbon must exhibit motion relative to the focused laser beam, since a "fresh" area of the target ribbon must be exposed to each laser pulse. Therefore, a need exists in miniature structures manufacturing industry for pulse-position synchronization techniques applicable to forward transfer processes which are free of disadvantages of the devices and systems of the prior art.

SUMMARY OF THE INVENTION

It is therefore an object of the present invention to provide a method and apparatus for pulse-position synchronization in miniature structure manufacturing processes in which precise coordination between the relative motion of the elements of the fabrication tool and activation or deactivation of the source of energy is achieved.

It is a further object of the present invention to provide a method of pulse-position synchronization in direct write technology which permits the material carrier element to be advanced between laser pulses to an unexposed spot adjacent to an already ablated area to permit ablation by a next laser pulse. This provides efficient utilization of the depositable material of the deposition layer mounted or located on the material carrier element.

It is another object of the present invention to provide a method for pulse-position synchronization which includes exposing a target to a first pulse of energy. A pause in the exposure is provided while relative motion at a maximum speed between the target and the energy source is introduced. The relative motion speed between the target and the energy source is reduced or terminated while exposing the target to a second pulse of energy.

It is still a further object of the present invention to provide a method for pulse-position synchronization in a fabrication tool capable of operating in both patterned "additive" and "subtractive" modes of operation. With respect to the "additive" mode of operation, pulses of energy impinge onto a material carrier element (a.k.a. target ribbon) to ablate a deposition layer for transferring a depositable material of the deposition layer onto a substrate. In a "subtractive" mode of operation pulses of energy impinge onto a substrate for micromachining the surface of the substrate according to a desired pattern.

In accordance with the present invention a method for pulse position synchronization in miniature structures manufacturing processes is carried out in a fabrication tool capable of operating in a patterned "additive" and "subtractive" modes. The fabrication tool includes a substrate, a material carrier element, a source of energy capable of generating pulses of energy and a control unit operatively coupled to the source of energy and the target.

In the "additive" mode of operation, the deposition layer formed on the material carrier element is ablated within predetermined areas upon exposure to pulses of energy in order that the ablated depositable material advances or is transferred from the deposition layer to a substrate for deposition.

Alternatively in the "subtractive", i.e., micromachining, mode of operation, the material carrier element is removed from the laser beam path, and the substrate is ablated at predetermined areas upon exposure to pulses of energy for creating various vias, waveguides, channels, or other patterned recesses.

In both modes of operation pulse-position synchronization is carried out by and within the fabrication tool by:
generating a first pulse of energy from a source of energy,
exposing a predetermined area of the target (which is the material carrier element in the "additive" mode of operation, or the substrate in the "subtractive" mode of operation) to the first pulse of energy,
terminating the first pulse of energy,
initiating relative motion between the target and the source of energy,
slowing or terminating relative motion speed between the target and the source of energy,
generating a second pulse of energy, and
exposing the target (in an area discrete from the first area) to the second pulse of energy.

In the time period defined by the sequential pulses of energy, the relative motion between the target and the source of energy is driven at relatively high speed. While being exposed to pulses of energy, the relative motion between the target and the source of energy is slowed to less than 10% of the predetermined maximum speed or alternatively the relative motion is terminated.

In the "additive" mode of operation, it is important that the second pulse impinges onto: (a) a non-ablated area of the deposition layer; and (b) a non-ablated area adjacent to that area already ablated by the first pulse of energy. In this manner, a fresh area of the deposition layer is used for each laser pulse, and efficient utilization of the material of the deposition layer is achieved.

To achieve this, the speed of the target ribbon relative to the laser must be at least as high as the speed of the substrate relative to the laser. This may be accomplished in several ways: (a) by attaching the ribbon to the substrate (contact transfer), (b) by moving the target ribbon at a constant speed that exceeds the maximum speed of the substrate, or (c) by programming the control unit to adjust the speed of the ribbon so that it tracks the speed of the substrate.

The target ribbon and substrate may travel in different directions during material deposition. Additionally, the target ribbon and substrate motions may trace out different patterns. For example, the target ribbon may be arranged in a reel-to-reel configuration, such as that used in a movie projector and the substrate may trace out a complicated two-dimensional pattern. With regard to the motion of the target, the key issue is that its motion be such that a fresh area is presented to each laser pulse. It is not necessary that the motion of the target be closely synchronized to the firing of the laser, although synchronization schemes are preferred that would result in more efficient utilization of the target.

The forward transfer deposition system of the present invention permits the capability of material removal, which is gained by removing the target ribbon from the laser path and focusing the laser directly on the substrate thus performing a "subtracting" mode of operation.

By applying the pulse-position synchronization technique in conjunction with optimized motion patterns, uniformity of deposition may be improved and variations in thickness minimized.

The source of energy may be a laser generating a laser beam, sources of electron beams or ion beams. If the source of energy is a laser, an ultraviolet laser is preferably used. Where a UV laser is used, the material carrier element is made transparent to the ultraviolet radiation to permit the laser beam to impinge directly onto the deposition layer through the material carrier element.

The present invention is further directed to a device which monitors the motion of the ribbon target, substrate, and source of energy to produce an output pattern of electrical pulses capable of driving a source of energy to generate pulses of energy or to suppress the same. These electrical pulses are delivered at a rate (or interval) that is a function of the relative position between the target ribbon, substrate, and the source of energy.

These and other novel features and advantages of this invention will be fully understood from the following detailed Description of the Accompanying Drawings.

DESCRIPTION OF THE PREFERRED EMBODIMENTS

Figure 1:
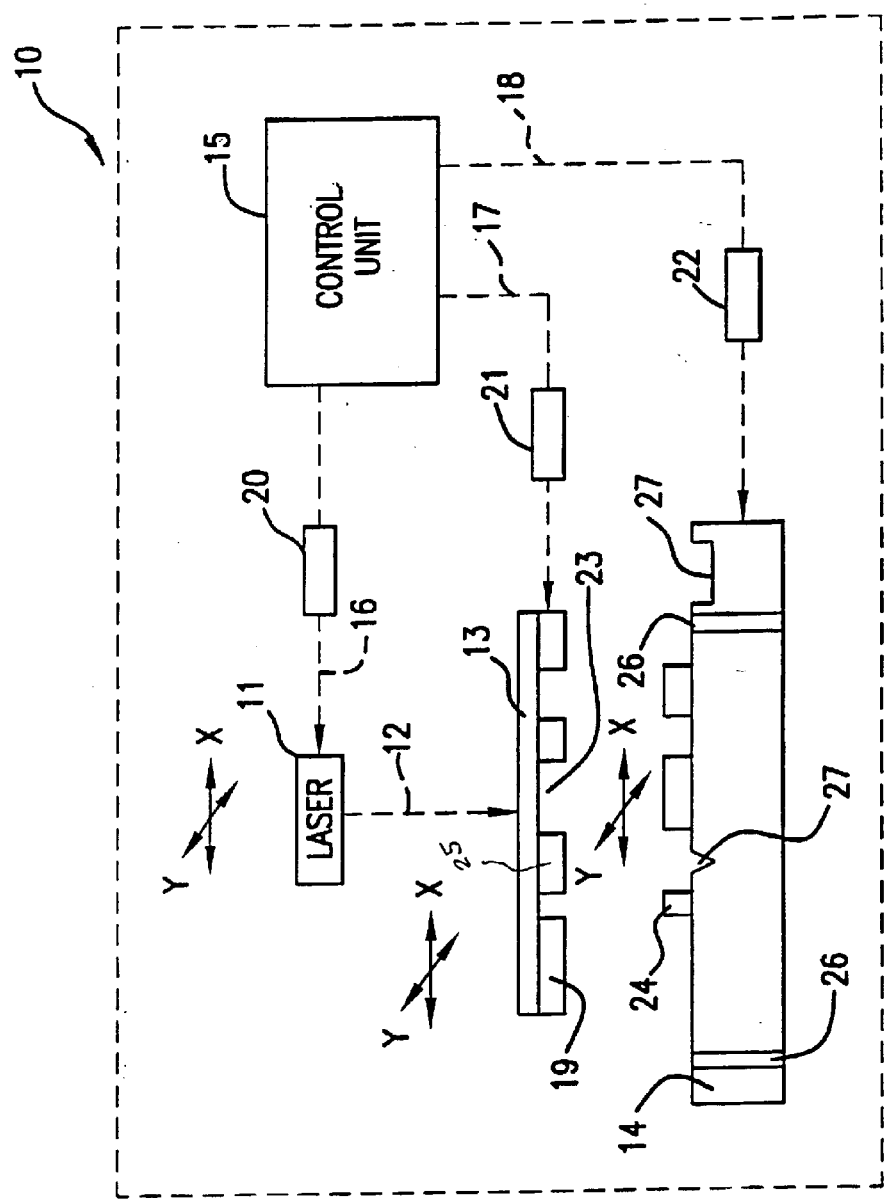
FIG. 1 is a schematic representation of the fabrication tool using pulse-position synchronization technique of the present invention.

Referring to FIG. 1, the fabrication tool system 10 of the present invention includes a source of energy 11 capable of generating pulses of energy 12, a material carrier element 13, a substrate 14, and a control unit 15. The control unit 15 is operatively coupled to the source of energy 11 through a communication channel 16, to the material carrier element 13 through a communication channel 17, and to the substrate 14 through a communication channel 18.

Although the source of energy 11 may be either an ultraviolet laser capable of generating UV laser beams, a source of electron beams, or source of ion beams, for sake of simplicity, a UV laser will be further referred herein as the source of energy 11.

The ultraviolet laser 11, such as an excimer laser, may be pulsed preferably at a rate about 10 Hz and may have a pulse width shorter than 10 microseconds.

The material carrier element 13 includes a deposition layer 19 facing the substrate 14. To allow the laser pulses to impinge upon the deposition layer 19, the material carrier element 13 is formed transparent to the ultraviolet radiation.

The deposition layer 19 contains a depositable material, such as powders, metals, composites, alloys, ceramics, and a vaporizable substance which may be a binder, a molecular precursor, and/or a solvent. The vaporizable substance rapidly decomposes when exposed to an energetic pulse to propel the other constituents of the depositable material to the substrate 14. Powders may be composed of a distribution of powder sizes to enable a closely packed matrix. Molecular precursors react to produce the externally generated densification energy (thermal or optical) or to produce an exothermic reaction when activated from the source of energy 11.

The control unit 15, described in detail in further paragraphs with reference to FIGS. 4–7, is a device that controls the entire operation of the fabrication tool system 10 by changing modes of operation of the fabrication tool system 10 (by either intercepting the material carrier element 13 with the laser pulse or by allowing a direct access of the laser pulse to the surface of the substrate 14). The control unit further synchronizes the relative motion between the material carrier element, substrate and the laser, as well as actuating and deactuating of the laser 11. The "additive" process carried out in the fabrication tool 10 is essentially a Direct Write deposition process which may use Matrix Assisted Pulse Laser Evaporation, Laser Induced Forward Transfer, or Forward Transfer Processes.

The communication channels 16, 17, and 18 include electromechanical translation units 20, 21, and 22, respectively, which are capable of translating data transmitted from the control unit 15 into mechanical displacement of the laser 11, material carrier element 13 and the substrate 14 in order that the control unit 15 is capable of controlling and driving the motion of the major elements of the fabrication tool 10.

Simultaneously, through the communication channels 16, 17, and 18, the control unit "reads" the positions of the source of energy 11, material carrier element 13, and the substrate 14 in order that the control unit 15 is able to monitor on one or more axes the motion of the laser 11, material carrier element 13 and the substrate 14. By "reading" positions of motors or stages of the units 20, 21, 22, and/or the scanning mirrors of the laser 11, the control unit 15 produces an output pattern of electrical pulses capable of commanding or controlling the laser 11.

The electrical pulses are transmitted through the communication channel 16 to the laser 11 in order to command the control unit 15 for actuation and termination of the laser 11 to generate and/or to terminate laser pulses in precise synchronization with the relative motion of the laser 11, material carrier element 13 and the substrate 14 in a predetermined synchronization pattern.

The electrical pulses are delivered at rates (or intervals) that are a function of the position of the laser 11, material carrier element 13, and the substrate 14. Under computer control, prescribing pulsing patterns may be generated by a CAD/CAM program or other known control software. Thus, under the control of the control unit 15, the precise location of deposition events or ablating laser pulses may be attained.

In one of the embodiments, shown in FIG. 2, the pulse-position synchronization may be carried out in the following manner:

exposing the target (material carrier element 13 or substrate 14) to a first laser pulse from the laser 11, pausing the exposure of the target while providing relative motion between the target and the laser, and substantially stopping relative motion between the target and the laser, exposing the target to a second laser pulse.

With slight modification, the pulse-position synchronization of the present invention may be also carried out in the following manner:

exposing a target to a first laser pulse;

pausing the exposure of the target while providing relative motion between the target and the laser at a predetermined maximum speed, and substantially slowing (or stopping) the relative motion between the target and the laser, while exposing the target to a second laser pulse.

In this process of the relative motion between the target and the laser can be slowed to less than 10% of the predetermined maximum speed while exposing the target to the second laser pulse.

Figure 2:
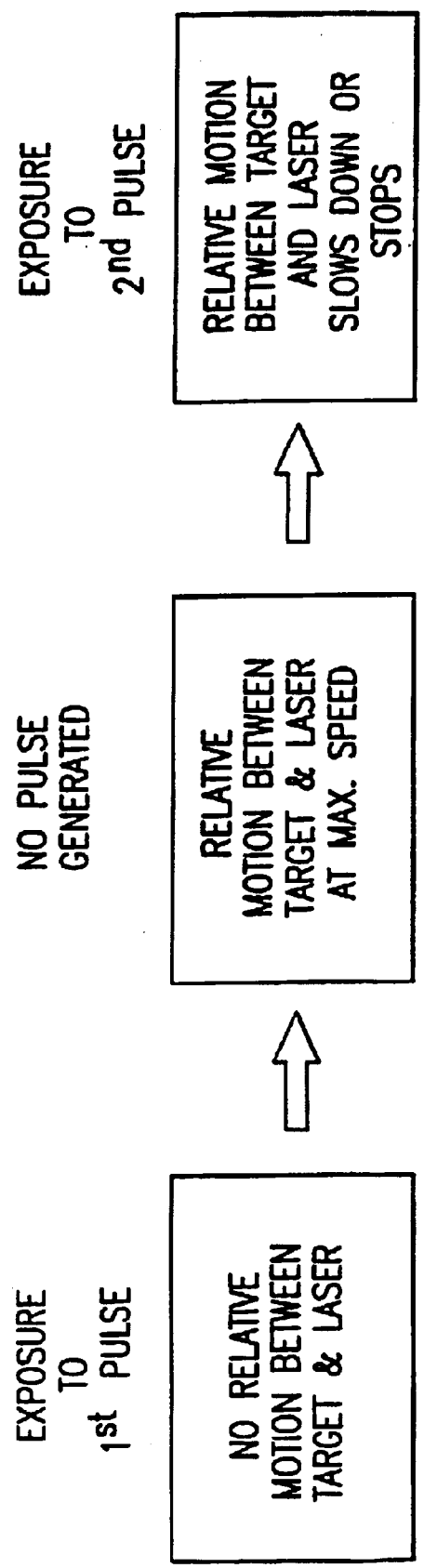
FIG. 2 is a schematic representation of the steps of the method for pulse-position synchronization of the present invention.

Referring to both FIGS. 1 and 2, in the "additive" mode of operation (the material carrier element interferes with the laser pulse) the exposure to the first laser pulse takes place at a predetermined area 23 within which the depositable material of the deposition layer 19 is ablated to be transferred to the substrate 14 for deposition thereon as a miniature structure 24.

Once the first ablation at the area 23 has been accomplished, the laser pulse is seized by the control unit 15 and the laser 11 moves to another area 25 of the deposition layer 19. It is important in the fabrication tool 10 of the present invention, that the area 25 chosen by the control unit 15 is a non-ablated area adjacent to the area 23, thus providing an efficient utilization of the deposition layer 19. After the control unit 15 coordinates the laser 11 with the area 25 of the deposition layer 19, the second laser pulse is generated (relative motion between the laser and the material carrier element is slowed down or stopped completely) and ablates the area 25 of deposition layer 19.

The miniature structure 24 created during the patterned "additive" process in the fabrication tool 10 may include an electrical element, mechanical, or electromechanical element, etc. Electrical elements can be formed which would include resistors, capacitors, sensors, inductors, antennae, etc.

In the patterned "subtractive" process, when the material carrier element 13 does not intercept the laser pulses 12, the laser 11 is aligned with a predetermined area of the substrate 14 under the control of control unit 15, in order that the laser pulses 12 impinge directly upon the substrate 14 to create holes, vias 26, channels 27, registration marks, waveguides, gratings, scribe lines. During the "subtractive" (micromachining) process, etching, trimming or cleaning of the substrate may be performed.

The fabrication tool 10 can be used with only a single rough alignment of the elements (substrate, material carrier element, laser) and does not require registration marks, since switching between the patterned "additive" mode and the "subtractive" mode of operation can be completed without removing the substrate 14 from the fabrication tool 10.

The system is operable at any pressure and temperature and may have a controlled atmosphere (oxidizing, reducing or inert).

Referring now to FIGS. 3A–3F, a stepwise process of motion-synchronized patterning of laser pulses providing for a close packed arrangement of the laser "shots" is shown. With regard to FIG. 3A, an arbitrary area 28 is preselected on the substrate 14 to be filled with laser "shots" in a manner to provide the smoothest possible surface. This can be accomplished by selecting a suitable pulse spacing D (best shown in FIG. 3C) which is generally less or equal to the laser spot diameter. The laser pulse separation distance D is substantially the same in both the X and Y directions.

Figure 3A:
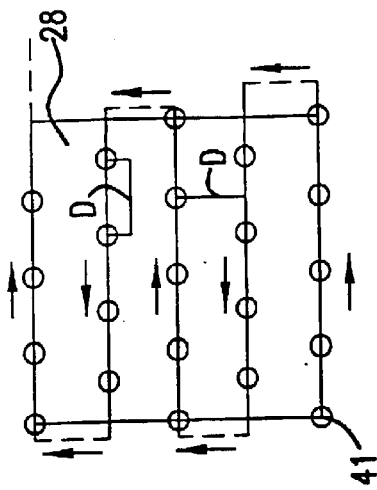
FIGS. 3A–3F are schematic diagrams illustrating motion synchronized patterning of laser pulses according to the present invention.
Figure 3B:
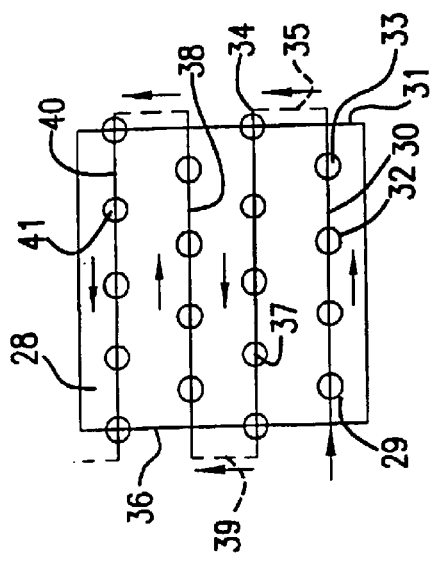
Figure 3C:
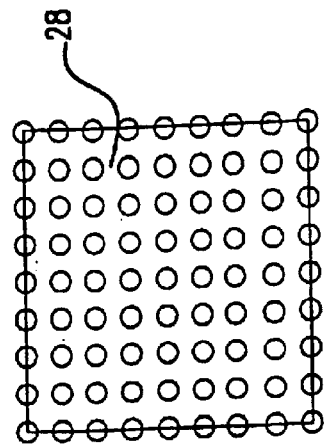

The laser is raster scanned in a pattern shown in FIG. 3B which begins at the initial point 29 at the bottom of the area 28 and follows along the line 30 to the right towards the side 31 of the area 28. The centers of the laser pulses coincide with the centers of the diagram circles 32. When the last laser shot 33 on the line 30 is made, the laser 11 is deactuated and the relative disposition between the target and the laser is changed to align the laser with a line 34 (the dashed line 35 represents change of relative interposition between the target and the laser when the laser is blanked or disabled).

Along the line 34, the laser pulses are sequentially placed onto the area 28 of the target 11 from the side 31 of the area 28 towards the side surface 36 thereof. By pulsing the laser 11 along the line 34 at predetermined pulse spacing D, a row of laser spots 37 is formed at the area 28 of the target. When the last laser spot (adjacent to the side 36 of area 28) on the line 34 is made, the laser 11 is disabled, and the control unit 15 changes a relative disposition between the laser 11 and the target in order to align the laser 11 with a line 38 of the area 28. Transition from the line 34 to the line 38 is shown in dashed line 39 representing a change in relative disposition between the laser and the target when the laser is disabled or blanked. The process continues until the last row 40 of the laser spots 41 is completed. Spot centers are then said to be in a close packed arrangement.

Figure 3D:
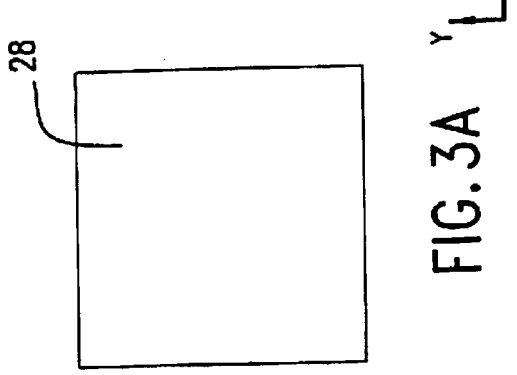
Figure 3E:
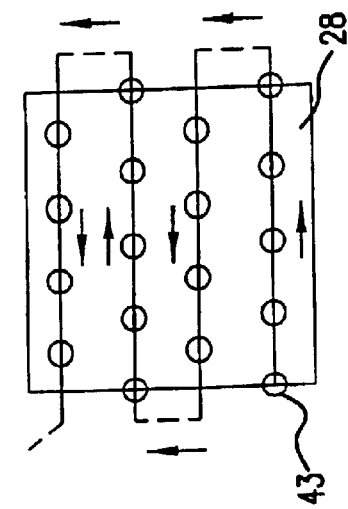

Increasing the number of pulses per unit area by a factor of $N^2$ can be accomplished while preserving a close packed distribution of laser spots. This is accomplished by repeating similar scans with the starting point 41 (shown in FIG. 3C) offset from the original starting point 29 shown in FIG. 3B. The similar scan is repeated as shown in FIGS. 3D and 3E with starting points 42 and 43, respectively, offset from the starting points 41 and 29.

Figure 3F:
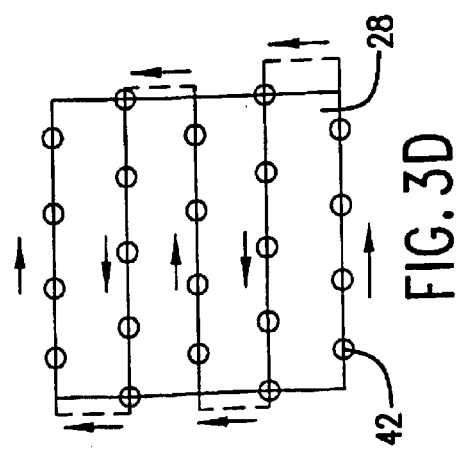

The superimposed pattern of four scans, shown in sequence in FIGS. 3B–3E, is illustrated in FIG. 3F showing a close packed arrangement of the laser shots on the area 28 providing for an optimally smooth surface.

The advantages of the fabrication technique of the present invention have been attained due to the design of the apparatus 10, and particularly due to a functional performance and operational approach of the control unit 15, best shown in FIGS. 4–7. The control unit 15 coordinates all aspects of deposition/ablation process;

provides interfacing for operator control and monitoring;

monitors all critical subsystems (including optical systems) of the apparatus 10 for quality control and safety;

provides communication with external systems and data bases, both internal and external; and provides for compatibility with CAD/CAM control.

Figure 4:
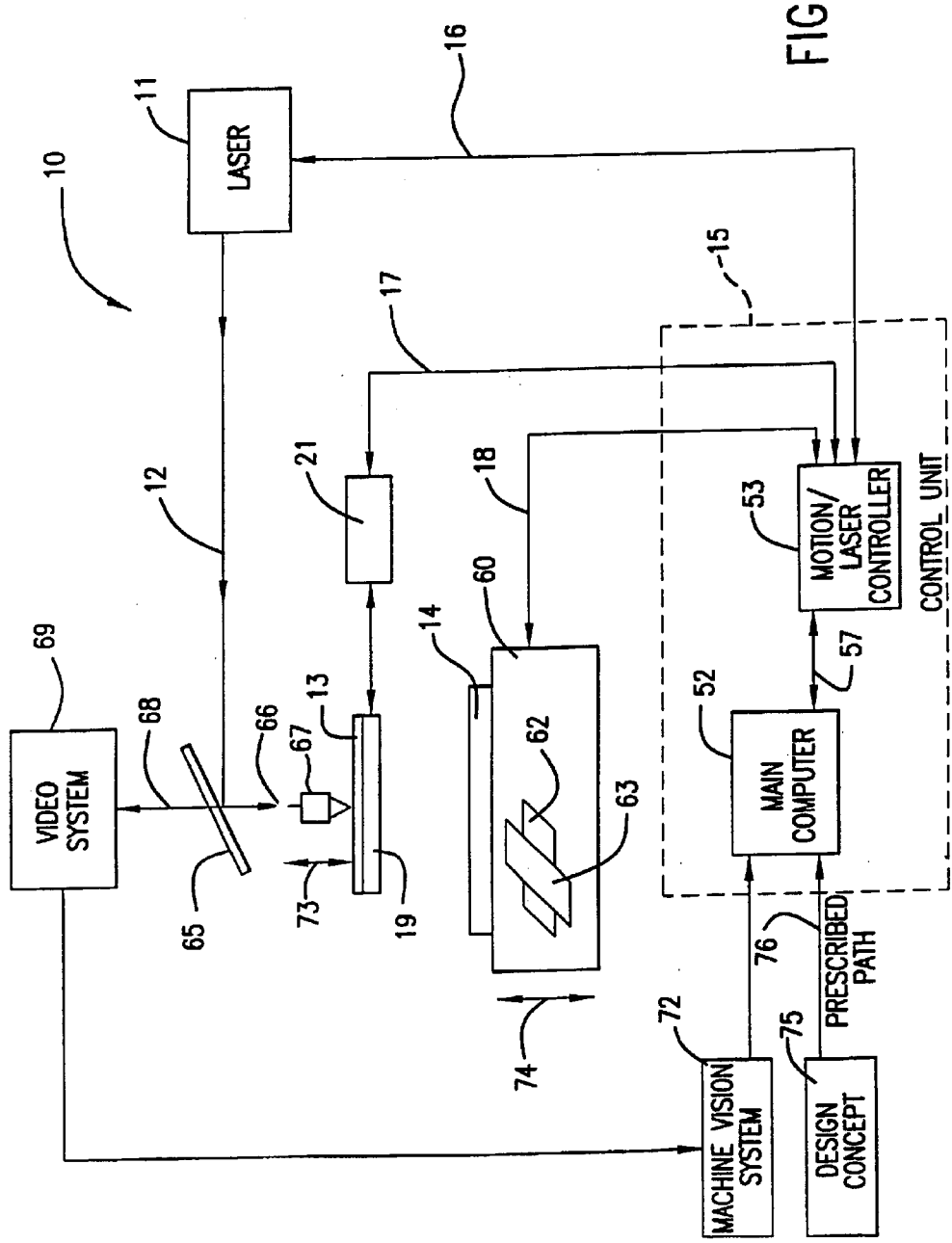
FIG. 4 is an overall block diagram of the apparatus of the present invention.

Referring to FIG. 4, showing the overall block diagram of the system of the present invention, the control unit 15 includes a main computer 52 and a motion/laser controller 53. The main computer 52 interchanges data with the motion/laser controller 53 through the bi-directional communication channel 57.

The motion/laser controller 53, may be external or internal to the main computer 52 and provides accurate (approximately 1 micron) dynamic closed loop position control of the substrate, material carrier element position, and scanning laser beam. The motion-laser controller 53 moves the substrate with high speed (up to 1 meter per second) and accuracy (approximately 1 micron) as well as providing for a smooth displacement for patterned deposition of ablating micromachining.

Substrate fixture 60 substantially holds the substrate, maintains it at a positional location, controls its temperature as well as atmosphere. The fixture 60 includes stages 62 and 63, best shown in FIGS. 4 and 5, which being controlled by the motion/laser controller 53, provide for a required displacement of the substrate 14 in accordance to a prescribed path, as will be described in detail in further paragraphs with reference to FIG. 5. In order to control and monitor the displacement and position of the substrate 14, the bi-directional communication link 18, shown in FIGS. 1 and 4, operatively couples the stages 62 and 63 of the substrate fixture 60 with the motion/laser controller 53 to convey control signals to the fixture 60 and readings of the position to the motion/laser controller 53.

The motion/laser controller 53 further communicates with the material carrier element 13 through the bi-directional communication channel 17 which has included therein the mechanism 21, shown in FIGS. 1 and 4. Motion/laser controller 53 is responsible for mechanical displacement of the material carrier element 13 either into intercepting position with the laser beam 12 (in the "material transfer" mode of operation) or away from interception with the laser beam 12 (in the "material removal" mode of operation).

The uniqueness of the system of the present invention is in that the pulse-position synchronization technique is used not only for laser micromachining to remove material, but also for the forward transfer technique for material deposition. Without pulse-position synchronization the number of forward transfer events per unit of displacement varies as the substrate 14 accelerates and decelerates, resulting in thickness variations of the deposited material.

In the laser forward transfer process for deposition, the problem is complicated by the fact that the material carrier element 15 is between the substrate 14 and the laser 11. In order for the process of the material deposition to be efficient and the miniature structures formed by uniform depositions of the material, the material carrier element 13 must exhibit motion relative to the focused laser beam. A fresh area 25, shown in FIG. 1, of the deposition layer 19 must be used for each laser pulse.

Responsive to this requirement of the material deposition process, the mechanism 21, shown in FIGS. 1 and 4, is adapted to change the position of the material carrier element 13 with respect to the laser beam 12 in accordance with the prescribed path for attaining the effective utilization of the depositable material of the deposition layer 19, deposition of a specific depositable material contained in the deposition layer 19, and deposition of the depositable material on an aimed area of the substrate 14. Depending on the type of the material carrier element 13, mechanism 21 has distinctive design features adapted for the particular type of the material carrier element. Mechanism 21 mechanically displaces the material carrier element 13 as prescribed by the motion/laser controller 53 through the channel 17. The mechanism 21 may include "reel-to-reel" mechanism, spinning-sliding vacuum system, or other motion actuating mechanisms.

Figure 8A:
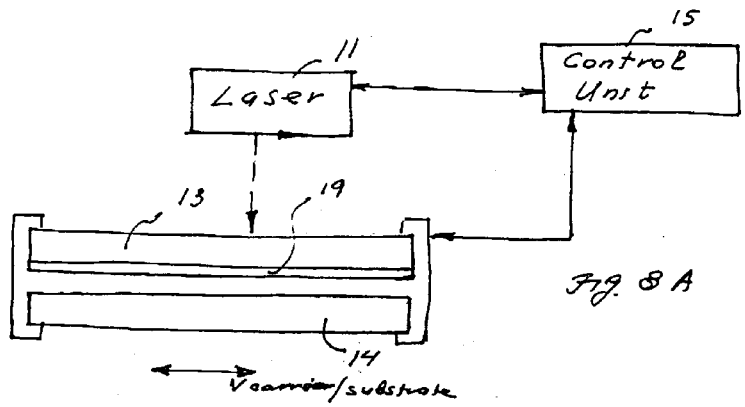
FIG. 8A shows schematically the material carrier element attached to the substrate.
Figure 8B:
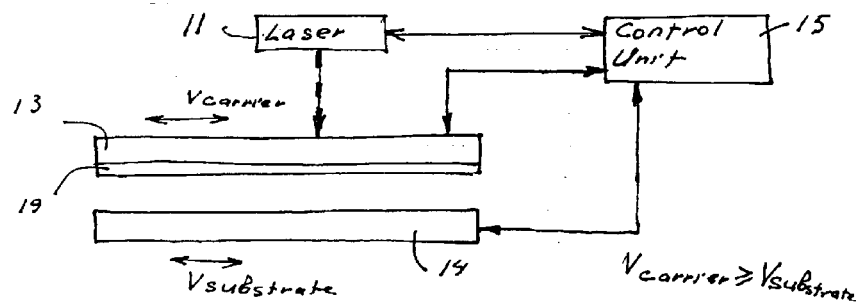
FIG. 8B shows schematically the motion of the material carrier element with the constant speed exceeding the speed of the substrate.
Figure 8C:
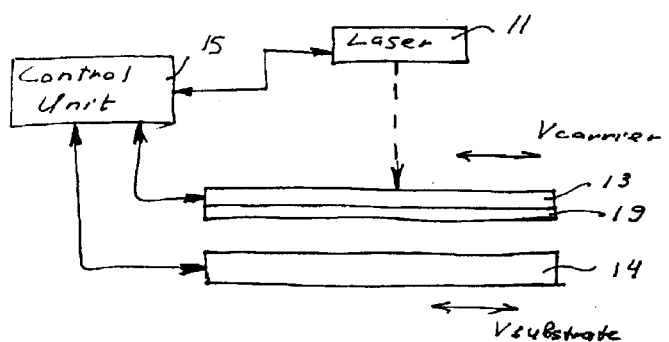
FIG. 8C shows schematically the embodiment in which the speed of the material carrier element is adjusted in accordance with the speed of the substrate.

Generally, the speed of the material carrier element 13 relative to the laser must be at least as high as the speed of the substrate 14 relative to the laser. This is accomplished in the system 10 of the present invention in several ways:

(a) by attaching the material carrier 13 to the substrate for contact transfer, as shown in FIG. 8A, (b) by moving the carrier 13 at a constant speed that exceeds the maximum speed of the substrate, or (c) by programming the controller to adjust the speed of the ribbon so that it tracks the speed of the substrate, as is shown in FIG. 8C.

The system 10 of the present invention contemplates that the control unit 15 additionally performs the optimization of the relative motion of the material carrier element traveling in different directions than the substrate during the process, as well as when the carrier 13 and substrate 14 motions trace out different patterns.

For example, in one embodiment, the target ribbon may be arranged in a reel-to-reel configuration, such as that used in a movie projector and the substrate may trace out a complicated two-dimensional pattern. The main issue is that a fresh area of the deposition layer 19 be closely synchronized to the firing of the laser. Synchronization schemes are included in the system 10 that result in more efficient utilization of the deposition layer 19.

The pulse-position synchronization technique of the present invention in conjunction with optimized motion patterns, such as those shown in FIG. 3 provide for improved uniformity of material deposition and minimized variations in thickness of the deposited material.

The control unit 15, as seen in FIGS. 1 and 4, is operatively coupled to the laser system 11 through the communication channel 16.

The laser 12 provides focusable pulsed energy source serving to:

transfer material from the deposition layer 19 to the substrate 14 in the "material transfer" mode of operation;

ablatively remove the material from the surface of the substrate 14 in the "material removal" mode of operation;

remove foreign material from the substrate and/or prepare and activate the substrate surface before or after deposition in the "material removal" mode of operation, particularly the "cleaning" mode of operation; and shape and refine deposited or existing structures to desired dimensions or values in the "material removal" mode of operation, particularly the "laser trimming" mode of operation.

As discussed in previous paragraphs, an ultraviolet pulsed laser is preferred due to its generally superior ablation characteristics for many materials. Specifically, all solid state frequency tripled neodymium vanadate lasers (radiating at approximately 355 nm), and frequency quadrupled energy lasers (radiating approximately at 266 nm) are preferred since they offer high repetition rates, short pulses, sufficient beam quality, high average power, and superior reliability at low maintenance.

The laser beam 12 impinges upon the splitter 65 whereat the laser beam 12 splits into a beam 66 directed to an objective 67 which further focuses the beam 66 and directs the same to either the surface of the material carrier element 13 or to the surface of the substrate 14. The mirror splitter 65 is highly reflective at the laser wavelength but transparent to the invisible spectrum for the video system 69. Another portion of the laser beam 12, particularly the beam 68, is directed to the splitter 65 to a video system 69 which includes a video microscope/video camera 70 and a video monitor 71, shown in FIG. 6. The signal from the video microscope/video camera 70 is supplied to a machine vision system 72 for image capture and processing. The video system/machine vision system permits an operator to accurately position substrate for registration and scaling with an existing pattern;

to measure and inspect the substrate; and to facilitate leveling, focusing and displacement of the substrate and the objective 67 in the direction shown by arrows 73 and 74.

The optical subsystem of the apparatus 10 of the present invention which includes the video system 69, video microscope/video camera 70, video monitor 71, and the machine vision system 72 is a well-known machine vision technique and is not intended to be described herein in further detail. The data from the machine vision system 72 is transmitted to the main computer 52 for storing, further processing, and for communication with the motion/laser controller 53 through the communication channel 57 for further control of the relative disposition between the elements of the system 10. Additionally, actuation-deactuation of the laser 11 is a function accomplished by the flow of data.

Referring again to FIGS. 4 and 5, showing a block diagram of the substrate motion/laser controller 53 for substrate motion and laser activation-deactivation control, the motion/laser controller 53, either external or internal to the main computer 52, provides accurate (approximately 1 micron) dynamic closed loop position control of the substrate. In this manner, the controller 53 monitors real time position of the substrate and coordinates the same with generating of laser pulses in order that the laser pulses can be triggered with very high alignment accuracy.

The main computer 52, through the motion-laser controller 53, transmits signals representative of a prescribed path (received from the "Design Concept" block 75 of the FIG. 4) which is a CAD/CAM developed design concept for layout of miniature structures or micromachining layout) is supplied to the motion control board 77 in accordance with the prescribed path controls an X-motor 79 and a Y-motor 80 to force the stages 62 and 63 carrying the substrate 14 to move the same in a required direction through a required distance.

Simultaneously, an X-encoder 81 is coupled to the X-stage 62, and the Y-encoder 82 is coupled to the Y-stage 63 for measuring X and Y displacements of the stages 62, 63 and translating them into the format understood by the motor control board 77 and the processing block 83. Data from X-encoder 81 and Y-encoder 82 are supplied through the channels 84 and 85, respectively to the motion control board for processing and used for generating various control signals outputted through outputs 86. These control signals may be further transmitted to the optical system of the laser for controlling the laser shutters, laser optical zoom, aperture selection, etc.

At the same time, the data corresponding to X and Y displacements of the stages 62 and 63 are transmitted from the X-encoder 81 and Y-encoder 82 through the communication links 87 and 88, respectively, to the processing block 83 where the X and Y displacements are processed and calculated according to the formula $$\left(\frac{X^2 + Y^2}{m}\right),$$

wherein X is a displacement of the stage 62, Y is the Y displacement of the stage 63 and m is an integer defining the number of pulses for a displacement vector.

The data from the processing block 83 is outputted through the channel 89 to a "distance—to pulse out" converter 90. The converter 90 thus receives vector displacement increment and in response thereto, generates a trigger pulse which is transmitted to the laser 11 through the line 91 for actuating-deactuating the laser 11. Thus, laser 11 generates laser beam 12 after a required displacement of the substrate 14 has been attained. The "distance-to-pulse-out" converter 90 is a well-known and commercially available converter manufactured by Aerotech, Inc. for operation of the known micromachining stations.

As was described in previous paragraphs, change of the relative disposition between the laser beam, substrate and/or material carrier element, may be implemented in following three fashions:

movement of the substrate with respect to the immovable laser beam; scanning of the laser beam with regard to the substrate and/or material carrier element; and combinatorial motion of the substrate and the laser beam. Thus, when scanning of the laser beam with respect to the substrate and/or material carrier element being chosen for operation, the system 10 of the present invention will operate in accordance with FIG. 6, illustrating the motion/laser controller 53, particularly, a subsystem thereof for laser motion and laser actuation-deactuation control.

Figure 5:
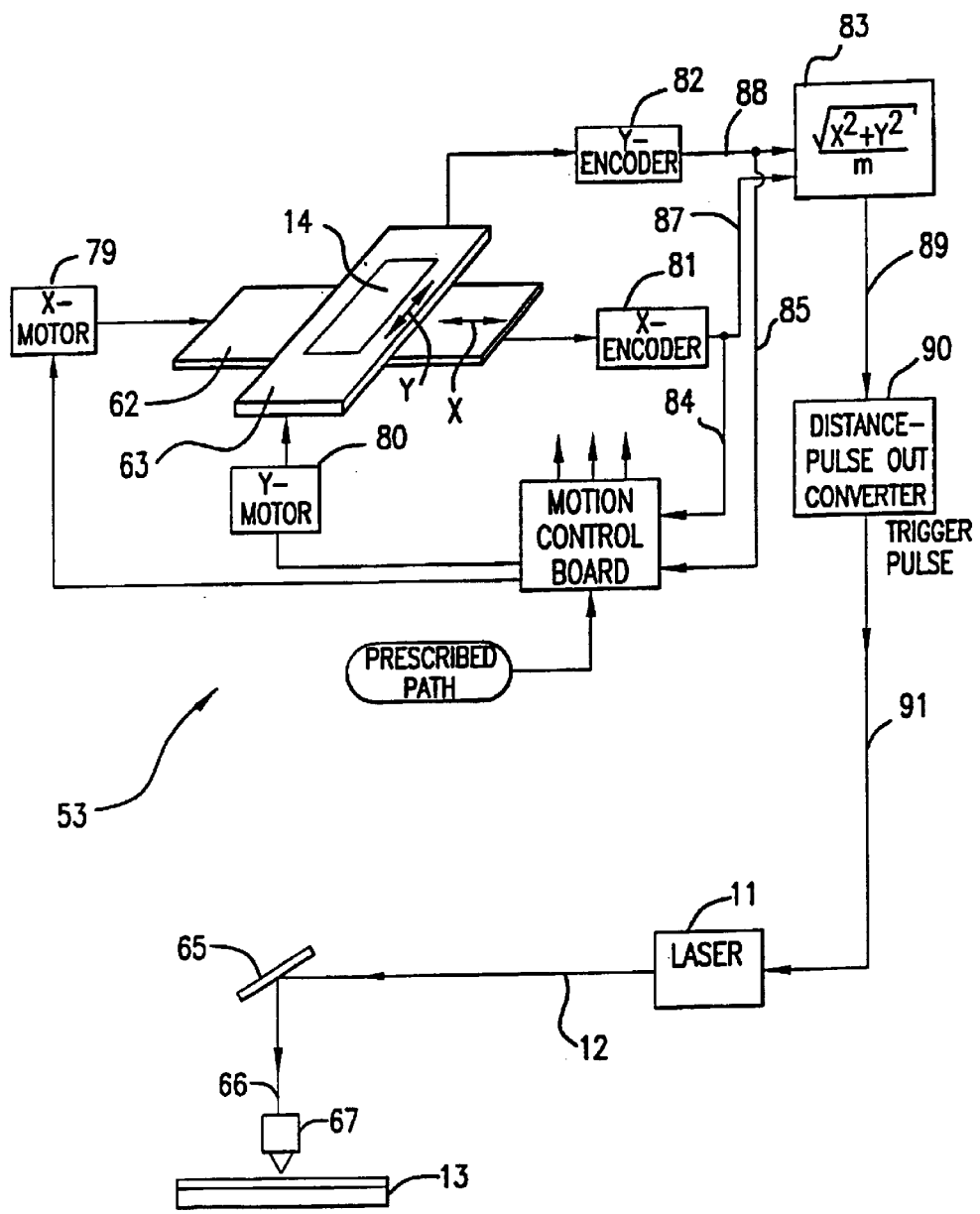
FIG. 5 is a block diagram of a controller subsystem of the apparatus of the present invention coordinating the substrate motion and laser activation-deactivation.
Figure 6:
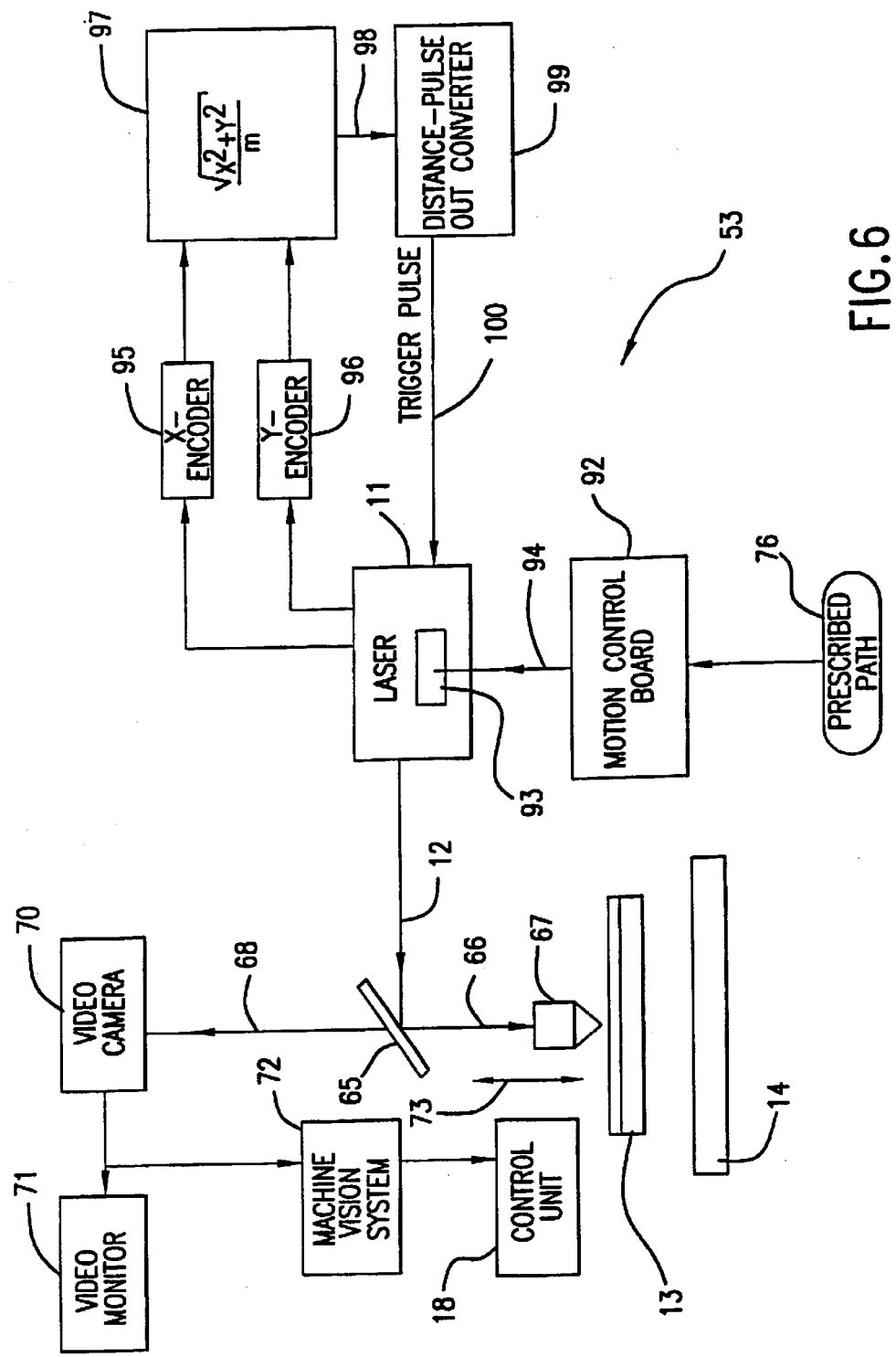
FIG. 6 is a block diagram of a controller subsystem for laser motion and laser actuation-deactuation control of the apparatus of the present invention.

As shown in FIG. 6, data representative of the prescribed path 76 are supplied to the motion control board 92 (which may coincide with the motion control board 77). The motion control board 92, in the manner described with respect to FIG. 5, transmits a control signal over the line 94 either to the optical system of the laser 11 or to mechanical stages carrying the laser 12 for displacement of the laser beam generated by the laser 11. Thus a scanning of the laser beam is provided over the surface of the material carrier element 13 or the substrate 14. X and Y encoders 95 and 96, or other means sensing displacement of the scanning laser beam receive information from the "optical system/stages" 93 of the laser 11 and transmit this information to a processing block 97 which processes the information received from the encoder 95, 96 either in the same manner as the processing block 83 of FIG. 5, or in any other fashion known to those skilled in the art, and outputs the data representative of the displacement of the laser beam through the line 98 to the "distance-to-pulse out" converter 20. The converter 20 converts the data representative of the displacement of the scanning laser beam into the controlling trigger pulses which are supplied to the laser 11 through the line 100 for actuating/deactuating the laser 11.

The generated laser beam 12 is further directed to the material carrier element 13 or the substrate 14 as described in the previous paragraphs. In this manner, the firing of the laser beam will be coordinated in precise fashion with the scanning of the laser beam with regard to the substrate 14 or the material carrier element 13.

The laser beam travels to the target (material carrier elements 13 or the substrate 14) through the objective 67. The objective 67 is provided for final imaging of the UV laser beam and video magnification. The objective 67 is mounted on a focusing stage providing displacement in the direction shown by arrows 73 to permit proper imaging regardless of the substrate height, and regardless of whether the material carrier element is in the beam path.

Figure 7:
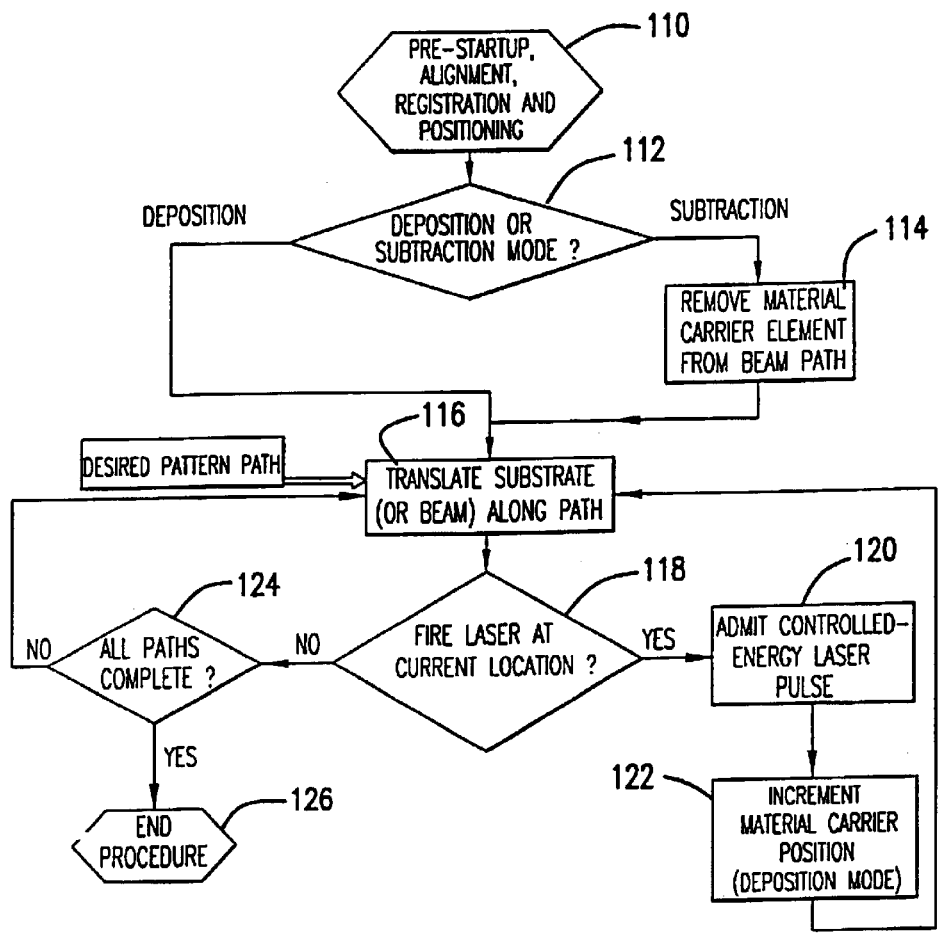
FIG. 7 is a flow chart diagram of the computer operational principle of the control unit of the apparatus of the present invention.

Referring to FIG. 7, showing a block diagram of the operational principles of the control unit of the apparatus of the present invention, the flow chart begins with block 110 corresponding to the pre-start-up procedure which includes alignment of the elements (substrate, material carrier element, laser beam) of the system, registration and positioning. Initially, the material carrier element is maintained in an interception path position with the laser. From the block 110, the logic moves to the block 112 "Deposition or subtraction mode?" If a subtraction ("material removal" mode of operation) is chosen, the logic moves to the block 114 "Remove material carrier element from the beam path". In accordance with the command of the block 114, the control unit 15 then outputs a control signal to mechanism 21, best shown in FIG. 4, for displacing the material carrier element 13 away from the interception position with the laser beam 12.

From the block 114, the logic moves to the block 116 "Translate substrate (or beam) along prescribed path".

If in the logic block 112, the deposition ("material transfer" mode of operation) is chosen, the logic moves again to the block 116. The logic block 116 receives a desired pattern path which corresponds to the prescribed path 76 shown in FIGS. 4–6. Thus, upon receiving the desired pattern path, the logic block 116 changes relative disposition between the substrate and the beam in accordance with the prescribed path.

From the block 116, the flow chart moves to the logic block 118 "Fire laser at current location?". If the laser has to be fired, i.e., the answer is "Yes", the logic moves to the block 120 "Admit controlled-energy laser pulse". At this instance, the motion/laser controller 53, as best shown in FIGS. 4–6, "commands" the laser 11 to generate a laser pulse which impinges at a predetermined area of the substrate 14 (in the "material removal" mode of operation), or the material carrier element 13 (in the "material transfer" mode of operation).

After the laser beam modifies either the deposition layer 19 of the material carrier element 13 or the surface of the substrate 14, the flow chart moves to the logic block 122 "Increment materials carrier position (deposition mode)". In this instance, the control unit 15 deactuates the laser 11, thus seizing the laser beam, and moves the material carrier element 13 to the next position according to the prescribed path 76 if the apparatus 10 operates in the "materials transfer" mode of operation. In block 122, the control unit 15 synchronizes the relative motion of the material carrier element and the laser to provide for exposition of the "fresh" area of the deposition layer 19 to the next laser pulse.

If however the apparatus 10 operates in the "material removal" mode of operation, the control unit 15 seizes the laser beam and moves the substrate to the next position in accordance with the prescribed path 76. Thus, from the logic block 122, the flow chart returns to the logic block 116, where the translation of the substrate (or the laser beam) is performed in accordance with prescribed path 76.

If however the answer to the logic block 118 is "No", meaning that the laser is not to be fired at a current location of the substrate or the laser beam, the logic flows to the block 124 "All Paths Complete?". If the answer is "Yes", the logic flows to the "End Procedure" block 126.

If however, in the logic block 124, it is decided that not all prescribed paths have not been yet completed, i.e., the answer is "No", the logic returns to the block 116 to translate the substrate (or the laser beam) along the prescribed path 76 for further leading the operational flow either along the loop comprised of logic blocks 118, 120, 122 and 116; or along the loop comprised of the logic blocks 118, 124, 116, in sequence.

As it is clear from the above disclosure, the technique for pulse position synchronization in miniature structure manufacturing processes applied to Direct Write/micromachining technology, can greatly improve uniformity, reproducibility, and overall process control.

Known materials used in this invention which are transparent to laser beams include fuse silica, borosilicate glass, polyester films such as Mylar, acrylic as well as a wide variety of other compositions well-known in the art.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A method for pulse-position synchronized deposition of a material in manufacturing processes, comprising the steps of:
   (a) providing a fabrication tool, including:
      a substrate,
      a material carrier element positioned in proximity to said substrate, said material carrier element having a deposition layer formed thereon,
      a source of energy generating pulses of energy directed towards said substrate and ablating said deposition layer at a predetermined area thereof upon exposure of said predetermined area of said deposition layer of said material carrier element to said pulses of energy,
      control means operatively coupled to said substrate, said material carrier element, and said source of energy, said control means controlling generation of pulses of energy and controlling speed and direction of relative motion between said source of energy, said substrate and said material carrier element;
   (b) initiating relative motion between said source of energy and said substrate with a first speed;
   (c) initiating relative motion between said source of energy and said material carrier element with a second speed, said second speed being a function of said first speed; and
   (d) generating said pulses of energy responsive to relative linear displacement between said substrate and said source of energy for transferring a material of said deposition layer from said predetermined area to a series of points on said substrate, for maintaining fixed increments of substrate displacement between said points.

2. The method of claim 1, wherein said first speed is equal to said second speed.

3. The method of claim 1, wherein said second speed exceeds said first speed.

4. The method of claim 1, further comprising the steps of:
adjusting said second speed in accordance with said first speed.

5. The method of claim 1, further comprising the step of:
synchronizing the relative motion between said source of energy and said material carrier element with generating of said pulses of energy for exposure of unablated portion of said predetermined area of said deposition layer to said pulses of energy.

6. The method of claim 1, further comprising the step of:
attaching said material carrier element to said substrate.

7. The method of claim 1, further comprising the steps of:
generating a first pulse of energy from said source of energy;
exposing said predetermined area of said material carrier element to said first pulse of energy;
terminating said first pulse of energy; initiating said relative motion between said material carrier element and said source of energy;
slowing said relative motion between said material carrier element and said source of energy;
generating a second pulse of energy; and
exposing another predetermined area of said material carrier element to said second pulse of energy.

8. The method of claim 7, wherein said relative motion between said material carrier element and said source of energy is performed at a predetermined maximum speed.

9. The method of claim 8, wherein said relative motion between said material carrier element and said source of energy is slowed to less than 10% of said predetermined maximum speed while exposing said another predetermined area of said material carrier element to said second pulse of energy.

10. The method of claim 7, wherein said relative motion between said material carrier element and said source of energy is slowed to a complete stop prior to exposure of said material carrier element to said second pulse generation.

11. The method of claim 7, wherein said relative motion between said material carrier element and said source of energy is initiated after said first pulse of energy has been substantially ceased.

12. The method of claim 1, further comprising the steps of: by means of said control means operating said fabrication tool in either of an additive mode of operation and a subtractive mode of operation.

13. The method of claim 7, wherein said another predetermined area is a non-ablated area of said deposition layer.

14. The method of claim 13, wherein said non-ablated another predetermined area is located adjacent to said predetermined area of said deposition layer.

15. The method of claim 14, further comprising the steps of:
transferring a depositable material of said deposition layer ablated from either of said predetermined and another predetermined areas thereof to said substrate for deposition thereon at locations substantially corresponding to said predetermined and said another predetermined areas of said deposition layer of said material carrier element.

16. The method of claim 1, wherein said source of energy includes an ultraviolet laser, and wherein said material carrier element is transparent to the ultraviolet radiation.

17. The method of claim 7, further comprising the steps of:
changing the relative disposition between said material carrier element and said source of energy until a non-ablated said another predetermined area of said deposition layer is found adjacent to said predetermined area ablated by said first pulse of energy.

* * * * *